United States Patent
Lee et al.

(10) Patent No.: US 7,202,727 B2
(45) Date of Patent: Apr. 10, 2007

(54) BI-DIRECTIONAL SIGNAL LEVEL SHIFT CIRCUIT

(75) Inventors: Yeon-Jun Lee, Suwon-si (KR);
Yong-Gu Lee, Bucheon-si (KR)

(73) Assignee: Samsung Electronics, Co., Ltd.,
MaeTan-Dong, YeongTong-Gu,
Suwon-si, Gyeonggi-Do (KR)

( * ) Notice: Subject to any disclaimer, the term of this patent is extended or adjusted under 35 U.S.C. 154(b) by 0 days.

(21) Appl. No.: 10/839,302

(22) Filed: May 5, 2004

(65) Prior Publication Data
US 2005/0122154 A1  Jun. 9, 2005

(30) Foreign Application Priority Data
Dec. 5, 2003  (KR) ............... 10-2003-0087898

(51) Int. Cl.
*H03L 5/00* (2006.01)
(52) U.S. Cl. .................. 327/333; 326/63; 326/80; 326/81
(58) Field of Classification Search ............. 327/333; 326/80, 81, 62–79
See application file for complete search history.

(56) References Cited

U.S. PATENT DOCUMENTS

| | | | |
|---|---|---|---|
| 5,877,633 A * | 3/1999 | Ng et al. ............... | 326/80 |
| 6,359,471 B1 * | 3/2002 | Mueller et al. ......... | 326/81 |
| 6,724,224 B1 * | 4/2004 | Li ............................ | 326/82 |
| 6,822,480 B1 * | 11/2004 | McCalmont ............ | 326/81 |
| 2004/0213357 A1 * | 10/2004 | Komiak ................... | 375/316 |
| 2005/0057296 A1 * | 3/2005 | Dharne et al. .......... | 327/333 |

* cited by examiner

*Primary Examiner*—Tuan T. Lam
(74) *Attorney, Agent, or Firm*—Cha & Reiter, L.L.C.

(57) ABSTRACT

A circuit for shifting a level between two bi-directional signals having different voltage levels. The circuit includes a first analog switch including a first switching control terminal connected to first directional signal stage, a first input terminal connected to a first level of operating voltage, and a first output terminal connected to a second directional signal stage, for performing a switching operation for the first input terminal and the first output terminal based on a state of logic level of a signal from the second directional signal stage. The circuit also includes a second analog switch including a second switching control terminal connected to the first directional signal stage, a second input terminal connected to a second level of operating voltage, and a second output terminal connected to the first directional signal stage for performing a switching operation for the second input terminal and the second output terminal based on a state of a logic level of a signal from the first directional signal stage.

23 Claims, 6 Drawing Sheets

BI-DIRECTIONAL SIGNAL LEVEL SHIFT CIRCUIT

CLAIM OF PRIORITY

This application claims priority from an application entitled "BI-DIRECTIONAL SIGNAL LEVEL SHIFT CIRCUIT", filed in the Korean Intellectual Property Office on Dec. 5, 2003 and assigned Serial No. 2003-87898, the contents of which are hereby incorporated by reference.

BACKGROUND OF THE INVENTION

1. Field of the Invention

The present invention relates to a circuit for shifting a level between two bi-directional signals having different voltage levels that are usable for such optical transceivers in optical communication networks. More particularly, the present invention relates to an $I^2C$ interface technique using such a circuit.

2. Description of the Related Art

In recent days, there has been a sudden increase of Internet users, as well as a rapid expansion of optical communication networks for third generation mobile communication. This increase in usage has created a demand for a variety of optical communication modules to accommodate the additional users, particularly those using third generation mobile communication equipment. In addition, so long as optical communication markets strive to create/expand long distance toll networks to connect one nation to another, or one city to another, the increased demand has gradually spread to local networks or subscriber networks. In fact, the demand for the optical communication modules is increasing daily.

Optical transceivers employed for such optical communication networks are essential parts of optical communication networks. Optical transceivers include a transmission module for converting electrical signals, such as voices, images and data, into optical signals to be transmitted via optical fibers, and a reception module for restoring received optical signals to the electrical signals. Typically, the transmission module and reception module are integrated in one unit. There are many types such optical transceivers, examples of which include the SFP (2.5G Small Form-factor Pluggable) level transceivers, and a more recent XFP (10G Small Form-factor Pluggable) level transceivers. The XFP level transceiver is widely used in schools, cyber apartments, etc., and the market for such items is growing.

Figure 1:
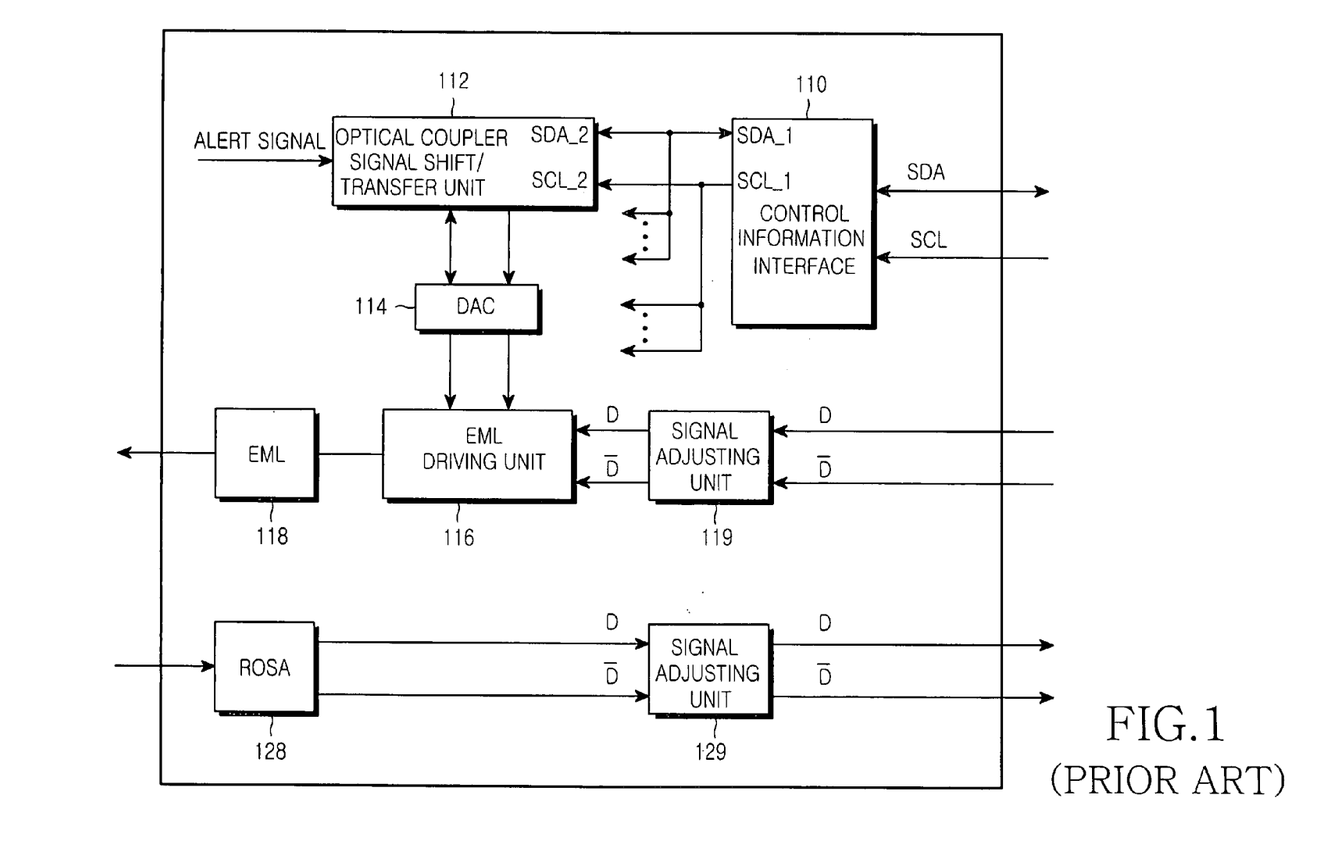
FIG. 1 is a schematic block diagram of a conventional optical transceiver employing a bi-directional signal level shift circuit for an I²C interface.

FIG. 1 is a schematic block diagram of a general optical transceiver employing a bi-directional signal level shift circuit for an $I^2C$ interface. $I^2C$ is a 2-wire serial interface standard that only requires two lines (clock and data) for full duplexed communication between multiple devices.

Referring to FIG. 1, the optical transceiver includes a receiver optical sub assembly (ROSA) 128 for receiving an optical signal and converting the optical signal into an electrical signal, an electrical signal adjusting unit 129 for performing an appropriate adjustment operation for the electrical signal output from the ROSA 128, a laser output unit (EML: Electro-absorption Modulated Laser) 118 for generating an optical signal to be transmitted based on a driving signal, an optical signal adjusting unit 119 for performing an appropriate adjustment operation for the optical signal to be transmitted, and an EML driving unit 116 for outputting the driving signal to the EML 118 based on a signal output from the optical signal adjusting unit 119.

In addition, the optical transceiver of the type shown in FIG. 1 further includes a control information interface 110 for exchanging control information and signals for network control with a central controller (not shown). The control information interface 110 outputs a variety of operational setting signals to the EML driving unit 116. For example, the control information interface provides operational setting signals to the EML driving unit for internal individual function units, based on corresponding received control information. At the present time, the EML driving unit 116 can be directly provided with a corresponding operational setting signal through a digital-to-analog converter (DAC) 114 if a level of power used in the EML driving unit 116 is equal to the level of power that is used in the control information interface 110. However, if the levels of power used in the EML driving unit 116 and the control information interface 110 are different, it is necessary to provide a signal level shift circuit, such as an optical coupler signal shift/transfer unit 112, in order to make the power levels equal. FIG. 1 shows an arrangement of the optical coupler signal shift/transfer unit 112 in connection between the control information interface 110 and the EML driving unit 116, with the digital-to-analog converter 114 arranged between the optical coupler signal shift/transfer unit 112 and the EML driving unit.

With regard to FIG. 1, the $I^2C$ (Inter-IC) communication system can be used as a communication system between the control information interface 110 and the central controller. The $I^2C$ communication system, which was originally developed by Philips Co. in Holland, is a synchronous bi-directional two-line communication system using two lines of serial data (SDA) and serial clock (SCL). An operating voltage level used in the $I^2C$ communication system is an LVTTL (Low Voltage Transistor-Transistor Logic) level (+3.3V) and, when the EML is used as a light source of the laser output unit 118, a level of operating voltage of the EML driving unit 116 is −5.2V. The control information interface 110 adjusts an operating point modulation voltage, a pulse width and an offset voltage of the EML driving unit 116 by means of the DAC 114. The DAC 114 receives the data according to the $I^2C$ communication system from the control information interface 110 and outputs the setting voltages. Since the I2C communication system uses the LVTTL level (+3.3V) and the operating voltages of the EML driving unit 116 and the DAC 114 is −5.2V, the optical transceiver using the system shown in FIG. 1 includes the signal shift circuit, i.e., the optical coupler signal shift/transfer unit 112 for matching signal levels between the control information interface 110 and the DAC 114. Thus, the optical coupler signal shift/transfer unit overcomes inoperability of the optical transceiver due to a level difference between signals of the EML driving unit and the control information interface.

Figure 2:
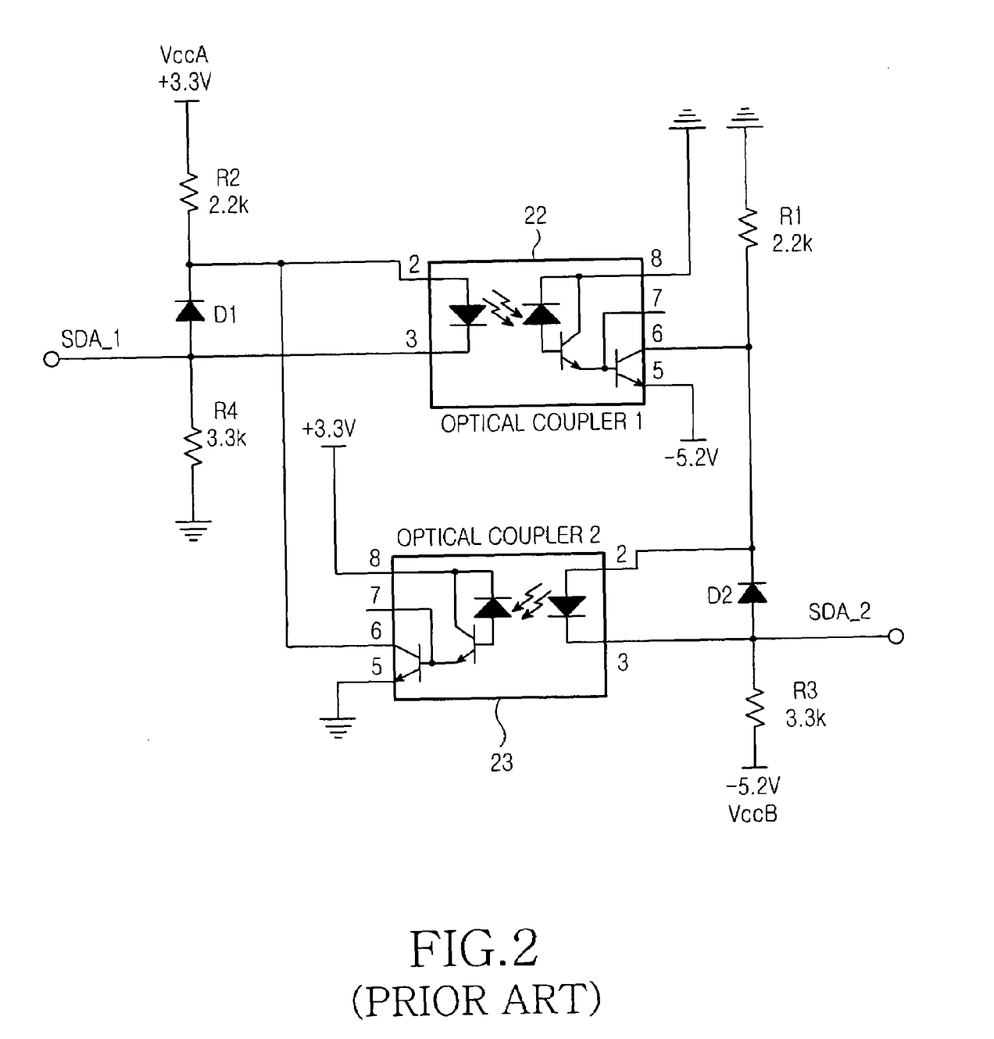
FIGS. 2 and 3 are detailed circuit diagrams of the optical coupler signal shift/transfer unit 112 of FIG. 1.
Figure 3:
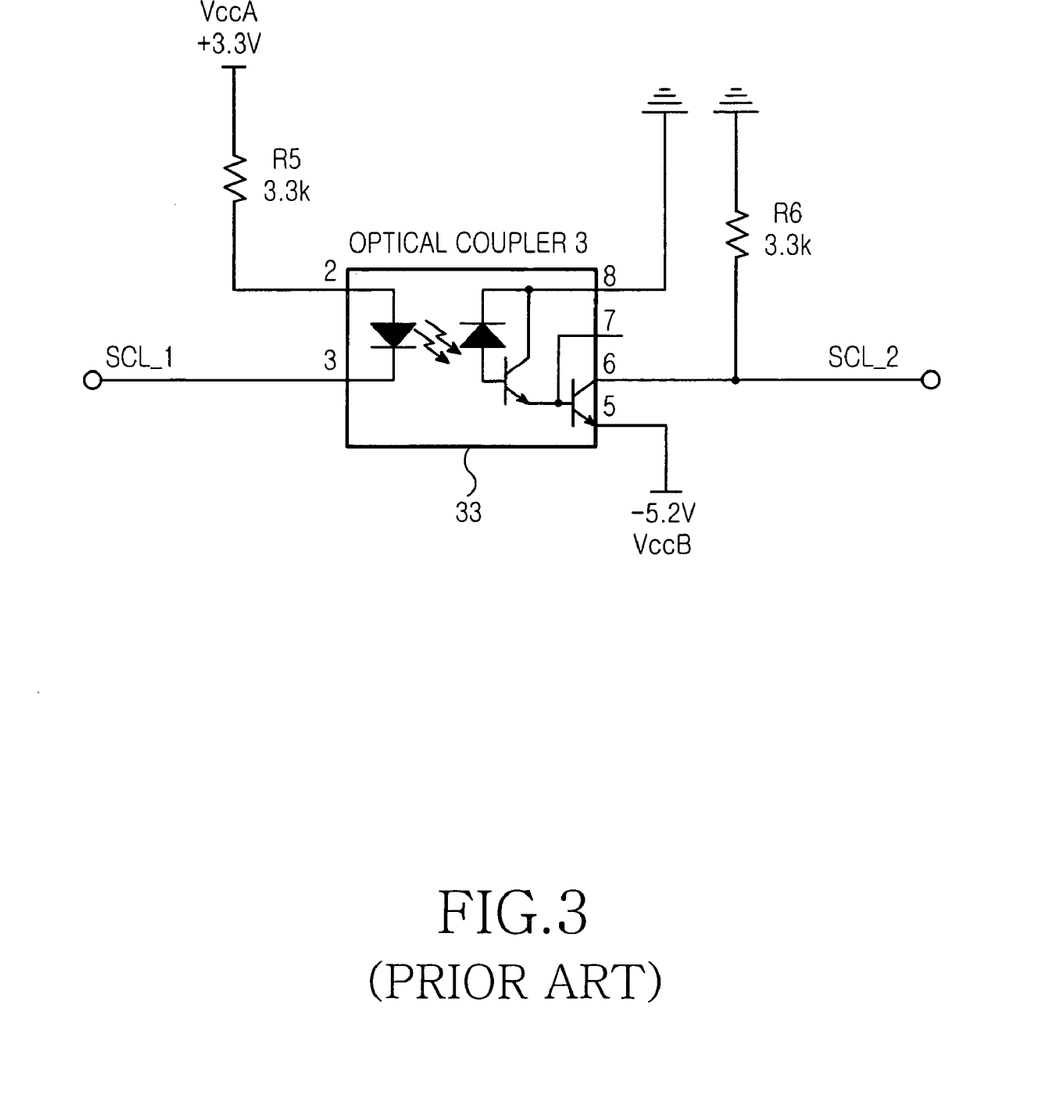

FIGS. 2 and 3 are detailed circuit diagrams of the optical coupler signal shift/transfer unit 112 shown in FIG. 1. In particular, FIG. 2 shows a circuit for bi-directional SDA signal level shift and FIG. 3 shows a circuit for unidirectional SCL signal level shift. An optical coupler 22, 23/33 shown in FIGS. 2 and 3 may be formed of 6N139 chips, which are available from 'Fairchild Semiconductor' Co.

Referring to FIG. 2, which illustrates the circuit for providing a bi-directional SDA signal level shift, a first operating voltage VccA (+3.3V) is input to a light emitting device of a first optical coupler 22 (typically terminal 2 of a 6N139 chip) of optical coupler 22 via a resistor R2 and an output terminal (terminal 3 of 6N139 chip) of the light emitting device is connected to a SDA_1 stage and a ground via a resistor R4. A first diode D1 is connected in a reverse-biased direction to the VccA between the input terminal and the output terminal of the light emitting device of optical coupler 1. Also, a second operating voltage VccB (−5.2V) is input to an SDA_2 stage and an output terminal (terminal 3 of 6N139 chip) of optical coupler 2 via a resistor R3 and an input terminal (terminal 2 of 6N139 chip) of optical coupler 2 is connected to a ground via a resistor R1. A second diode D2 is connected in a direction backward to the ground between the input terminal and the output terminal of the light emitting device of optical coupler 2.

On the other hand, a light receiving device of optical coupler 22 is configured to connect/disconnect the input terminal of the light emitting device of optical coupler 23 to/from the operating voltage, −5.2V, by performing an on/off switching based on the presence or absence of light emitted from the light emitting device. In other words, 6N139 terminals 5 and 6 of optical coupler 22 are connected respectively to the operating voltage of −5.2V and the ground via the resistor R1. In addition, a light receiving device of optical coupler 23 is configured to connect/disconnect the input terminal of the light emitting device of optical coupler 22 to/from the operating voltage of +3.3V by performing an on/off switching based on the presence or absence of light emitted from the light emitting device. In other words, 6N139 terminals 5 and 6 of optical coupler 23 are connected respectively to the ground and the operating voltage of +3.3V via the resistor R2.

With regard to the operation of the SDA signal level shift circuit as shown in FIGS. 2 and 3, when a signal is transmitted from the SDA_1 stage to the SDA_2 stage, if a signal SDA_1 has a high logic (+3.3V), light is not emitted from the light emitting device of optical transceiver 1, and accordingly, a signal SDA_2 goes to a logic high (a voltage resulting from the division of −5.2V by R1 and R3). Also, if the signal SDA_1 has a low logic level (0V), then light is emitted from the light emitting device of optical transceiver 1, and accordingly, the signal SDA_2 goes to a lowlogic level (−5.2V).

However, when a signal is transmitted from the SDA_2 stage to the SDA_1 stage, if the signal SDA_2 has a high logic level (0V), light is not emitted from the light emitting device of optical transceiver 2, and accordingly, the signal SDA_1 goes to a high logic level (a voltage resulting from the division of +3.3V by R2 and R4). Also, if the signal SDA_2 has a low logic level (−5.2V), then light is emitted from the light emitting device of optical transceiver 2, and accordingly, the signal SDA_1 goes to a low logic level (0V).

According to the above-described configuration and operation of the optical transceivers shown in FIG. 2, when VccA is 3.3V and VccB is −5.2V, since one of the optical couplers has a signal (SDA_1) as the LVTTL level by +3.3V and the other of the optical couplers has a signal (SDA_2) by −5.2V, signals according to the I2C communication system can be transmitted and received even at different voltage levels of +3.3V and −5.2V.

In addition, with reference to FIG. 3, the circuit for SCL signal level shift will now be described. Since an SCL signal is a unidirectional signal, it is shown in FIG. 3 that one optical coupler 33 (typically a 6N139 semiconductor) is used for the signal level shift. In transmission of the SCL signal, the first operation voltage VccA (+3.3V) is input to a light emitting device (6N139 terminal 2) of optical coupler 33 via resistor R5 and an output terminal (6N139 terminal 3) of the light emitting device is connected to an SCL_1 stage.

In addition, an SCL_2 stage is connected to a light receiving device of optical coupler 33 and a ground via a resistor R6. The light receiving device of optical coupler 33 is configured to connect/disconnect the SCL_2 stage to/from the second operating voltage VccB (−5.2V), by performing an on/off switching based on the presence or absence of light emitted from the light emitting device.

With regard to the operation of the SCL signal level shift circuit having the configuration as described above, if a signal SCL_1 has a high logic level (+3.3V), light is not emitted from the light emitting device of optical transceiver 33, and accordingly, a signal SDA_2 goes to a high logic level (0V). Also, if the signal SDA_1 has a low logic level (0V), then light is emitted from the light emitting device of optical transceiver 33, and accordingly, the signal SDA_2 goes to low logic (−5.2V).

As described above, although there has is a known circuit that provides a signal level shift using optical transceivers, such optical transceivers commonly are inconvenient in their use because of their relatively large size. For example, in the case of 6N139 chips of 'Fairchild Semiconductor' Co., an optical transceiver has a size of 9.91 mm×6.86 mm, which occupies a great deal of space on a substrate, for example, when three or more optical transceivers are mounted on the substrate.

SUMMARY OF THE INVENTION

Therefore, the present invention, which has been made in part to solve the above-mentioned problems associated with level shifting circuits. The present invention provides a circuit for shifting a level between two bi-directional signals having a different voltage level that occupies significantly less space on a substrate than level shifting circuits known heretofore.

The present invention also provides a circuit for shifting a level between two bi-directional signals with different voltage levels in I2C interfaces in optical transceivers used in optical communication networks, wherein the present invention is adapted for being manufactured with smaller size than known heretofore.

The above and other aspects of the present invention can be accomplished by the provision of a bi-directional signal level shift circuit comprising: a first analog switch including a first switching control terminal connected to one directional signal stage, a first input terminal connected to a first level of operating voltage, and a first output terminal connected to the other directional signal stage, for performing a switching operation for the first input terminal and the first output terminal based on a state of logic level of a signal from the one directional signal stage; and a second analog switch including a second switching control terminal connected to the other directional signal stage, a second input terminal connected to a second level of operating voltage, and a second output terminal connected to the one directional signal stage, for performing as witching operation for the second input terminal and the second output terminal based on a state of logic level of a signal from the other directional signal stage.

BRIEF DESCRIPTION OF THE DRAWINGS

The above and other aspects, as well the advantages of the present invention will be more clearly understood from the following detailed description taken in conjunction with the accompanying drawings, in which.

DETAILED DESCRIPTION

Now, preferred aspects of the present invention will be described in detail with reference to the annexed drawings. In the following description made in conjunction with preferred aspects of the present invention, a variety of specific elements such as constituent elements of various concrete circuits are shown. The description of such elements has been made only for a better understanding of the present invention. In other words, the elements are provided for purposes of illustration and not limitation, and those skilled in the art will appreciate that the present invention can be implemented without using the above-mentioned specific elements.

Figure 4:
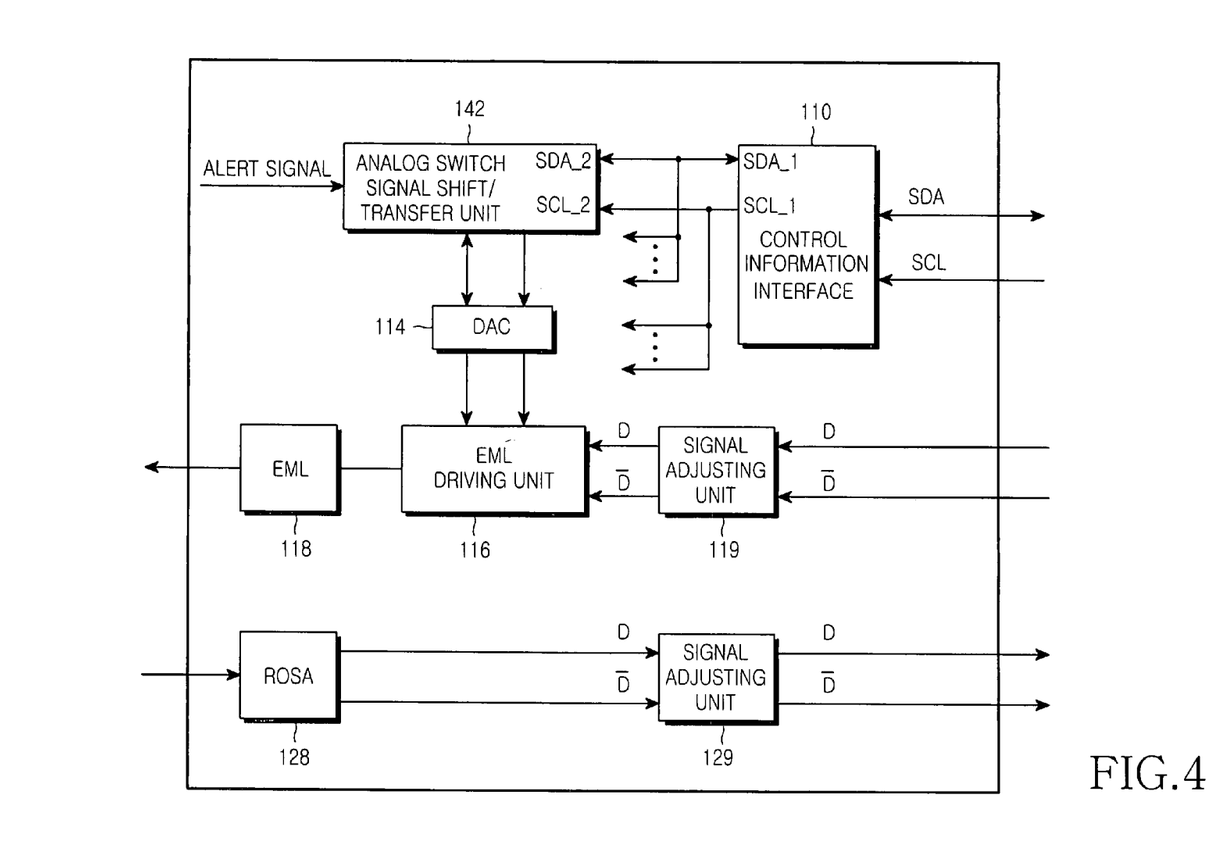
FIG. 4 is a schematic block diagram of an optical transceiver employing a bi-directional signal level shift circuit for I²C interface in accordance with a aspect of the present invention.

FIG. 4 is a schematic block diagram of an optical transceiver employing a bi-directional signal level shift circuit for an I2C interface in accordance with an aspect of the present invention. Referring to FIG. 4, the optical transceiver employing the bi-directional signal level shift circuit in accordance with the present invention generally includes a receiver optical sub assembly (ROSA) 128, signal adjusting units 119 and 129, a laser output unit (EML: Electro-absorption Modulated Laser) 118, and an EML driving unit 116, as in the conventional optical transceivers, an example of which is shown in FIGS. 1–3.

In addition, the optical transceiver includes a control information interface 110 for exchanging control information and signals for network control with a central controller (not shown), and an analog switch signal shift/transfer unit 142 for shifting a level of signal output when the control information interface 110 adjusts an operating point modulation voltage, a pulse width and an offset voltage of the EML driving unit 116 by means of the DAC 114, such that the level of signal is equal to levels of operating voltages of the EML driving unit 116 and the DAC 114.

Figure 5:
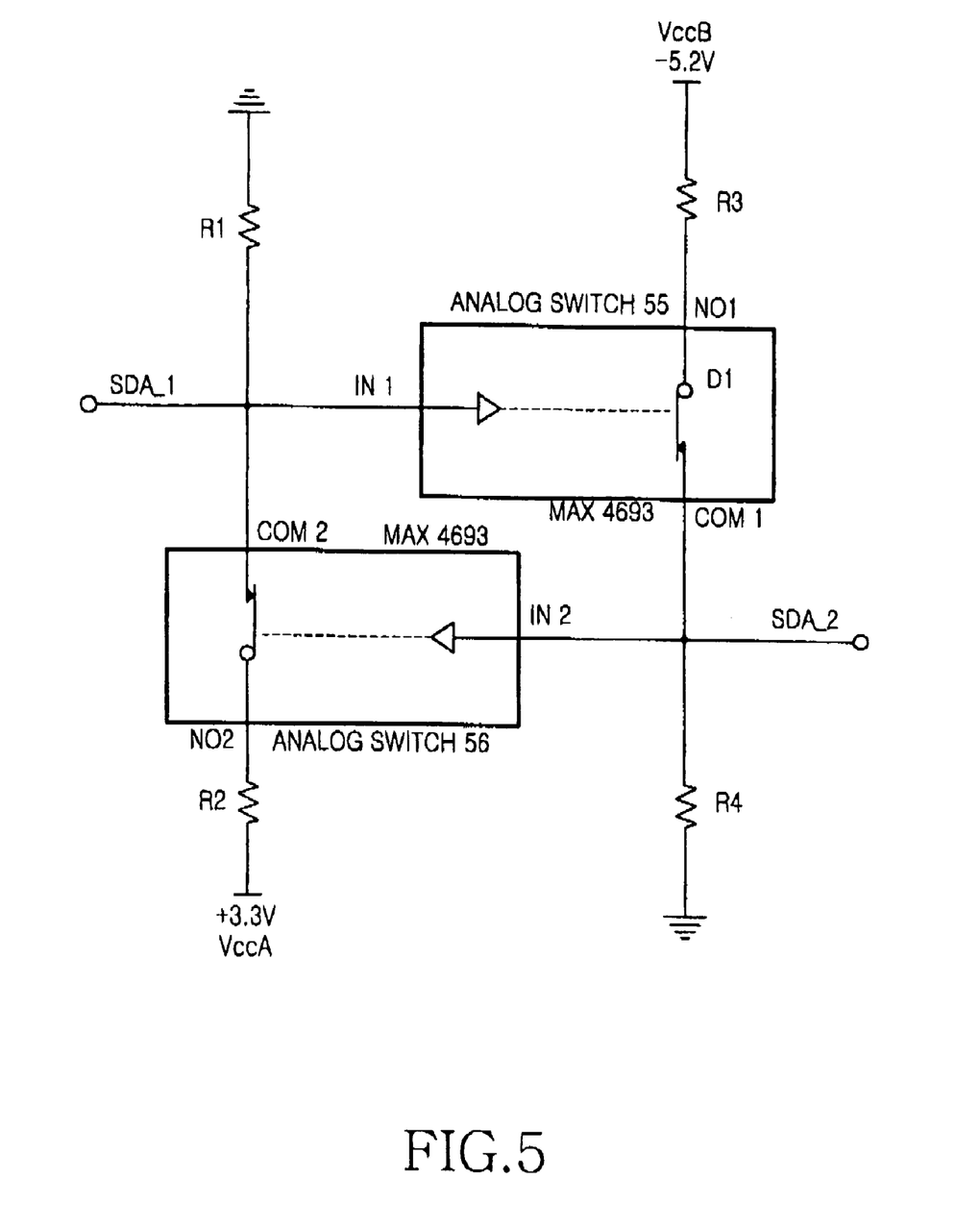
FIGS. 5 and 6 are detailed circuit diagrams of the optical coupler signal shift/transfer unit 112 of FIG. 1.
Figure 6:
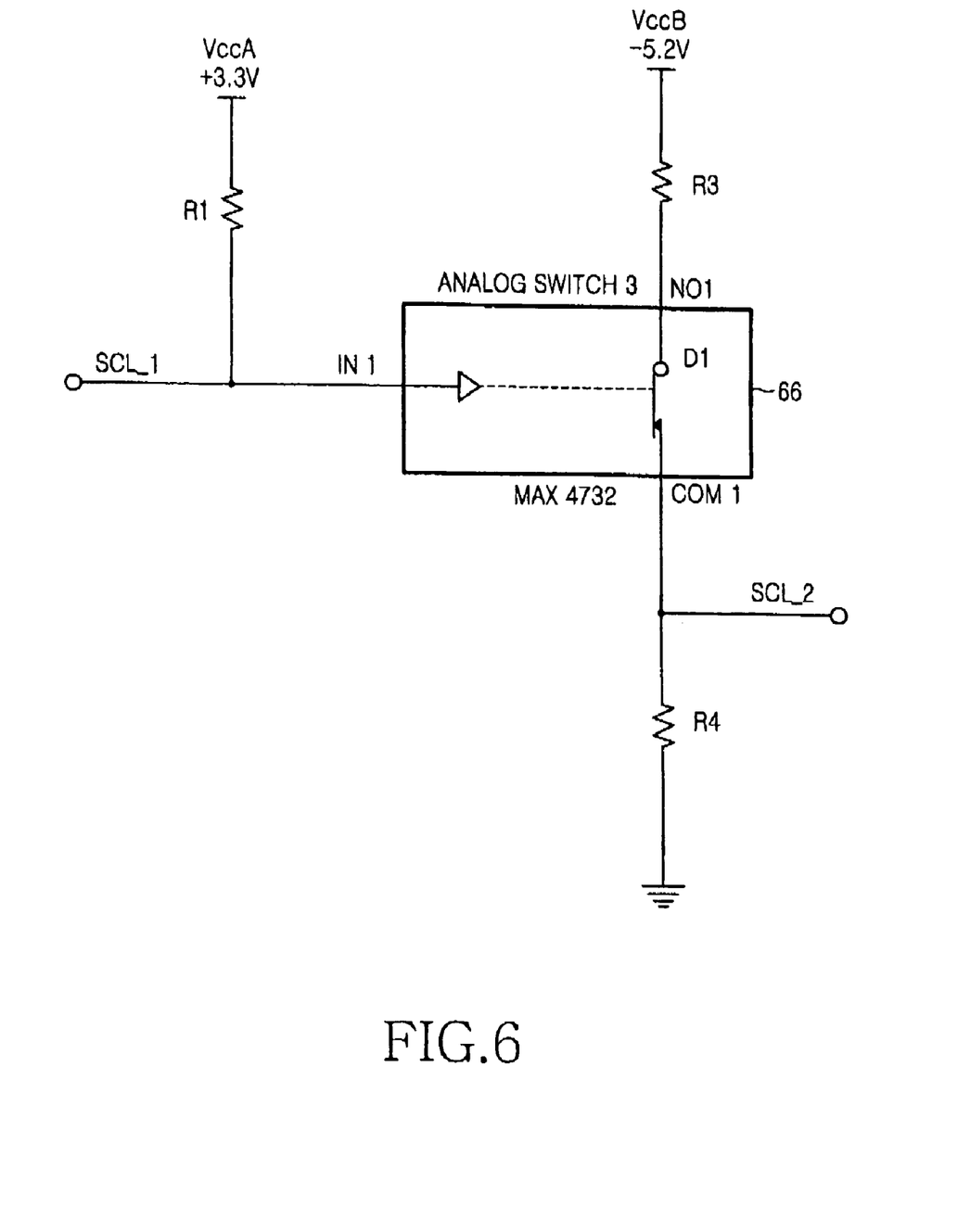

FIGS. 5 and 6 are detailed circuit diagrams of the analog switch signal shift/transfer unit 142 of FIG. 4, in accordance with the embodiment of the present invention. Particularly, FIG. 5 shows a circuit for bi-directional SDA signal level shift and FIG. 6 shows a circuit for unidirectional SCL signal level shift. An analog switch shown in FIGS. 5 and 6 may be formed of, for example, MAX4693 or MAX4732 chips, which are available from 'Maxim Integrated Products' Co. of Canada. However, it should be clearly understood that the present invention is no way limited to the above-mentioned semiconductors, their progeny, or equivalents thereof, as these items are merely examples of one way a person of ordinary skill in the art can practice the present invention.

Referring to FIG. 5, the circuit for bi-directional SDA signal level shift uses two analog switches 55 and 56. A control terminal IN1 of analog switch 55 is connected to an SDA_1 stage and a ground via a resistor 1. Of two terminals, an input terminal NO1 and an output terminal COM1 in analog switch 55, which are connected or disconnected based on a control level provided to the control terminal IN1, the input terminal NO1 is connected to a second operating voltage VccB (−5.2V) via a resistor R3 and the output terminal COM1 is connected to an SDA_2 stage and a ground via a resistor R4. In addition, a control terminal IN2 of the analog switch 2 is connected to the SDA_2 stage. Of two terminals, an input terminal NO2 and an output terminal COM2 in analog switch 56, which are connected or disconnected based on a control level provided to the control terminal IN2, the input terminal NO2 is connected to a first operating voltage VccA (+3.3V) via a resistor R2 and the output terminal COM2 is connected to the SDA_1 stage and a ground via resistor R1.

Now, the operation of the SDA signal level shift circuit having the configuration as described above in accordance with this aspect of the present invention will be described. When a signal is transmitted from the SDA_1 stage to the SDA_2 stage, if a signal SDA_1 has high logic (+3.3V), analog switch 55 is switched off, and accordingly, a signal SDA_2 goes to a high logic level(0V). Also, if the signal SDA_1 has a low logic level (0V), analog switch 55 is switched on, and accordingly, the signal SDA_2 goes to a low logic level (a voltage resulting from the division of −5.2V by R3 and R4).

On the other hand, when a signal is transmitted from the SDA_2 stage to the SDA_1 stage, if the signal SDA_2 has a high logic level (0V), MAX4693 analog switch 56 is switched on, and accordingly, the signal SDA_1 goes to a high logic level (a voltage resulting from the division of +3.3V by R2 and R1). Also, if the signal SDA_2 has low logic (−5.2V), analog switch 56 is switched off, and accordingly, the signal SDA_1 goes to a low logic level (0V).

According to the above-described configuration and operation of the signal shift circuit in accordance with the present invention, when VccA is 3.3V and VccB is −5.2V, since one of analog switches 55 and 56 has a signal (SDA_1) as the LVTTL level by +3.3V and the other of analog switches 55 and 56 has a signal (SDA_2) by −5.2V, signals according to the I²C communication system can be transmitted and received even at different voltage levels of +3.3V and −5.2V.

Although the signal shift circuit in accordance with the present invention has been described to have two different analog switches 55 and 56 for the SDA signal transfer in the above description, since it is common that the common chip comprising the analog circuit generally has one or more analog switches, analog switches 55 and 56 can be configured by a single chip containing at least two analog switches.

Next, referring to FIG. 6, the circuit for SCL signal level shift in accordance with the embodiment of the present invention will be described. Since a SCL signal is a unidirectional signal, it is shown in FIG. 6 that one analog switch 66 is used for the signal level shift. In transmission of the SCL signal, the control terminal IN1 of analog switch 66 is connected to an SCL_1 stage and the first operating voltage VccA (+3.3V) via a resistor R1. In addition, there are two terminals (an input terminal NO1 and an output terminal COM1 in analog switch 66), which are connected or disconnected based on a control level provided to the control terminal IN1. The input terminal NO1 is connected to a second operating voltage VccB (−5.2V) via a resistor R3 and the output terminal COM1 is connected to the SCL_2 stage and a ground via a resistor R4.

In accordance with the aspect of the present invention having the configuration described above and shown in FIG. 6, when considering the operation of the SCL signal level shift circuit, if a signal SCL_1 has high logic (+3.3V), the analog switch 66 is switched off, and accordingly, a signal SDA_2 goes to a high logic level (0V). Also, if the signal SDA_1 has a low logic level (0V), analog switch 66 is switched on, and accordingly, the signal SDA_2 goes to a low logic level (a voltage resulting from the division of −5.2V by R3 and R4).

As described above, the analog switches employed for the analog switch signal shift/transfer unit 142 in accordance with the present invention may comprise, for example, MAX4693 and MAX4732 chips manufactured by 'Maxim Integrated Products' Co. If, assuming arguendo, that the MAX4693 and MAX4732 chips are used, these chips have sizes of 2.02 mm×2.0 mm and 1.52 mm×1.52 mm, respectively. These dimensions permit arrangement of the switches with a remarkably reduced need for space on a substrate, as compared to the conventional optical coupler, such as the model (6N139) having the size of 9.91 mm×6.86 mm.

As described above, according to present invention, a circuit for shifting a level between two bi-directional signals with different voltage levels in I²C interfacing in optical transceivers in optical communication networks can be manufactured with significantly reduced size.

Although certain preferred aspects of the present invention have been disclosed for illustrative purposes, those skilled in the art will appreciate that various modifications, additions and substitutions are possible, without departing from the spirit of the invention and the scope of the accompanying claims. For example, although the present invention has been described to be applied to the I₂C communication system, it can also be applied to a variety of communication systems including the RS-232 system,. the RS-488 system, etc. The present invention can be used with many types of chips other than those disclosed, and could even be compatible with future generations of chips. Therefore, the scope of the invention is to be defined by the accompanying claims and their equivalents, not by the above-described illustration.

What is claimed is:

1. A bi-directional signal level shift circuit comprising:
    a first analog switch including a first switching control terminal connected directly to a first directional signal stage and a first resistor, the first resistor that is directly connected to a ground, including a first input terminal adapted for connection to a first level of an operating voltage via a third resistor, and including a first output terminal connected directly to a second directional signal stage and a fourth resistor, the fourth resistor that is directly connected to the ground, the first analog switch being configured to perform a switching operation for the first input terminal and the first output terminal based on a state of a logic level of a signal output from the first directional signal stage and configured to output to the second directional signal stage a logic level having a value based on values of the third and fourth resistors; and
    a second analog switch including a second switching control terminal connected directly to the second directional signal stage and the fourth resistor, a second input terminal adapted for connection to a second level of an operating voltage that is different than the first level of operating voltage via a second resistor, and a second output terminal connected directly to the first directional signal stage and the first resistor, the second analog switch being configured to perform a switching operation for the second input terminal and the second output terminal based on a state of a logic level of a signal from the second directional signal stage and configured to output to the first directional signal stage a logic level having a value based on values of the first and second resistors.

2. The bi-directional signal level shift circuit according to claim 1, wherein
    the first analog switch and the second analog switch are arranged in a single integrated circuit.

3. The bi-directional signal level shift circuit according to claim 1, wherein
    the first directional stage comprises a first serial data (SDA) stage;
    the second directional stage comprises a first serial data (SDA) stage.

4. The bi-directional signal level shift circuit according to claim 1, wherein
    the first input terminal and the first output terminal of the first analog switch are opened or closed according to the logic state of the signal output from the first directional stage; and
    the second input terminal and the second output terminal of the second analog switch are opened or closed according to the logic state of the signal output from the second directional stage.

5. The bi-directional signal level shift circuit according to claim 4, wherein when a signal is transmitted from the first directional stage to the second directional stage, if the first directional stage has a logic high state then the first input terminal and first output terminal are opened, and the second directional stage goes to a logic high state.

6. The bi-directional signal level shift circuit according to claim 4, wherein when a signal is transmitted from the first directional stage to the second directional stage, if the first directional stage has a logic low state then the first input terminal and first output terminal are closed, and the second directional stage goes to a logic low state.

7. The bi-directional signal level shift circuit according to claim 4, wherein when a signal is transmitted from the second directional stage to the first directional stage, if the second directional stage has a logic high state then the second input terminal and second output terminal are closed, and the first directional stage goes to a logic high state.

8. The bi-directional signal level shift circuit according to claim 4, wherein when a signal is transmitted from the second directional stage to the first directional stage, if the second directional stage has a logic low state then the second input terminal and second output terminal are opened, and the first directional stage goes to a logic low state.

9. The bi-directional signal level shift circuit as set forth in claim 1, further comprising:
    a third analog switch including a third switching control terminal connected to one directional serial clock (SCL) stage and adapted for receiving the second level of operating voltage, a third input terminal connected to the first level of operating voltage, and a third output terminal connected to the other directional SCL stage, for performing a switching operation for the third input terminal and the third output terminal based on a state of logic level of a signal from the one directional SCL stage.

10. An optical transceiver comprising the bi-directional signal level shift circuit according to claim 1, wherein said optical transceiver further comprises:
    a receiver optical sub assembly (ROSA);
    first and second signal adjusting units, wherein a first signal adjusting unit is connected to an output of the ROSA;
    a laser output unit;

a laser driving unit for controlling the output of the laser output unit, said laser driving unit having an input and an output, an output of said laser driving unit being provided to an input of the laser output unit and an input of said laser driving unit being connected to an output of the second signal adjusting unit; and a control information interface unit for exchanging control information and signals for network control, said control information interface unit being in communication with the first analog switch and the second analog switch unit for providing control of an operating point modulation voltage, a pulse width and an offset voltage for the laser driving unit to drive the laser output unit.

11. The optical transceiver according to claim 10, wherein the bi-directional signal level shift circuit is adapted for shifting a level of signal output when the control information interface unit adjusts an operating point modulation voltage, a pulse width, and an offset voltage output from the laser driving unit.

12. The transceiver according to claim 11, further comprising a digital-to-analog converter (DAC) arranged between the bi-directional signal level shift circuit and the laser driving unit.

13. A circuit for shifting a level between bi-directional signals according to an I$^2$C (Inter-IC) communication system, comprising:

a first analog switch including a first switching control terminal connected directly to a first directional serial data (SDA) stage and a first resistor, the first resistor that is directly connected to a ground, a first input terminal adapted for connection to a first level of operating voltage via a third resistor, and a first output terminal connected directly to a second directional SDA stage and a fourth resistor, the fourth resistor that is directly connected to the ground, the first analog switch being configured to perform a switching operation for the first input terminal and the first output terminal based on a state of a logic level of a signal from the first directional SDA stage and configured to output to the second directional SDA stage a logic level having a value based on values of the third and fourth resistors; and a second analog switch including a second switching control terminal connected directly to the second directional SDA stage and the fourth resistor, a second input terminal adapted for connection to a second level of operating voltage via a second resistor, and a second output terminal connected directly to the first directional SDA stage and the first resistor, the second analog switch being configured to perform a switching operation for the second input terminal and the second output terminal based on a state of a logic level of a signal from the second directional SDA stage and configured to output to the first directional SDA stage a logic level having a value based on values of the first and second resistors.

14. A method for bi-directional signal level shifting, comprising the steps of:

(a) connecting first switching control terminal of a first analog switch directly, to a first directional signal stage and a first resistor, the first resistor that is directly connected to a ground, and connecting a first input terminal of the first analog switch to a first level of an operating voltage via a third resistor, (b) connecting the first output terminal of the first analog switch directly to a second directional signal stage and a fourth resistor, the fourth resistor that is directly connected to the ground; and (c) connecting a second switching control terminal of a second analog switch directly to the second directional signal stage and the fourth resistor, connecting a second input terminal of the second analog switch to a second level of an operating voltage, via a second resistor, the second level of an operating voltage being different from the first level of operating voltage, and connecting a second output terminal of the second analog switch directly to the first directional signal stage and the first resistor; and (d) performing a switching operation for the first input terminal and the first output terminal based on a state of a logic level of a signal output from the first directional signal stage with the first analog switch and outputting to the second directional signal stage a logic level having a value based on values of the third and fourth resistors; and (e) performing a switching operation for the second input terminal and the second output terminal based on a state of a logic level of a signal from the second directional signal stage with the second analog switch, and outputting to the first directional signal stage a logic level having a value based on values of the first and second resistors.

15. The method according to claim 14, further comprising the step of arranging the first analog switch and the second analog switch in a single integrated circuit.

16. The method according to claim 14, wherein
the first directional stage comprises a first serial data (SDA) stage;
the second direction stage comprises a first serial data (SDA) stage.

17. The method according to claim 14, wherein
opening or closing the first input terminal and the first output terminal of the first analog switch according to the logic state of the signal output from the first directional stage; and
opening or closing the second input terminal and the second output terminal of the second analog switch according to the logic state of the signal output from the second directional stage.

18. The method according to claim 17, wherein when a signal is transmitted from the first directional stage to the second directional stage, if the first directional stage has a logic high state then the first input terminal and first output terminal are opened, and the second directional stage goes to a logic high state.

19. The method according to claim 17, wherein when a signal is transmitted from the first directional stage to the second directional stage, if the first directional stage has a logic low state then the first input terminal and first output terminal are closed, and the second directional stage goes to a logic low state.

20. The method according to claim 18, wherein when a signal is transmitted from the second directional stage to the first directional stage, if the second directional stage has a logic high state then the second input terminal and second output terminal are closed, and the first directional stage goes to a logic high state.

21. The method according to claim 14, wherein when a signal is transmitted from the second directional stage to the first directional stage, if the second directional stage has a logic low state then the second input terminal and second output terminal are opened, and the first directional stage goes to a logic low state.

22. The method according to claim 14, further comprising a step of:
    connecting a third analog switch including a third switching control terminal to one directional serial clock (SCL) stage and adapted for receiving the second level of operating voltage, connecting a third input terminal to the first level of operating voltage, and a third output terminal to the other directional SCL stage for performing a switching operation for the third input terminal and the third output terminal based on a state of logic level of a signal from the one directional SCL stage.

23. A method shifting a level between bi-directional signals according to an I²C (Inter-IC) communication system, comprising the step of:
    (a) connecting a first switching control terminal of a first analog switch directly to a first directional serial data (SDA) stage and a first resistor, the first resistor connected directly to a ground, connecting a first input terminal of the first analog switch to a first level of operating voltage via a third resistor, and connecting a first output terminal of the first analog switch directly to a second directional SDA stage and a fourth resistor, the fourth resistor connected directly to the ground;
    (b) connecting a second switching control terminal of the second analog switch directly to the second directional SDA stage and the fourth resistor, connecting a second input terminal of the second analog switch to a second level of operating voltage via a second resistor, and connecting a second output terminal of the second analog switch directly to the first directional SDA stage and the first resistor;
    (c) performing a switching operation for the first input terminal and the first output terminal based on a state of a logic level of a signal from the first directional SDA stage with the first analog switch, and outputting to the second directional SDA stage a logic level having a value based on values of the third and fourth resistors; and
    (d) performing a switching operation for the second input terminal and the second output terminal based on a state of a logic level of a signal from the second directional SDA stage with the second analog switch and outputting to the first directional SDA stage a logic level having a value based on values of the first and second resistors.

* * * * *